United States Patent
Han et al.

(10) Patent No.: US 6,461,984 B1
(45) Date of Patent: Oct. 8, 2002

(54) SEMICONDUCTOR DEVICE USING $N_2O$ PLASMA OXIDE AND A METHOD OF FABRICATING THE SAME

(75) Inventors: Chui-Hi Han; Nae-In Lee, both of Daejeon-shi; Sung-Hoi Hur, Seoul; Jin-Woo Lee, Jeolanam-Do, all of (KR)

(73) Assignee: Korea Advanced Institute of Science & Technology, Daejeon-shi (KR)

( * ) Notice: Subject to any disclaimer, the term of this patent is extended or adjusted under 35 U.S.C. 154(b) by 0 days.

(21) Appl. No.: 09/535,156

(22) Filed: Mar. 24, 2000

Related U.S. Application Data (62) Division of application No. 08/937,773, filed on Sep. 25, 1997.

(30) Foreign Application Priority Data

Mar. 18, 1997 (KR) .............................. 97-9096
Mar. 18, 1997 (KR) .............................. 97-9097

(51) Int. Cl.[7] ........................ H01L 21/31; H01L 21/469
(52) U.S. Cl. ........................ 438/788; 438/151; 438/257; 438/261; 438/771; 438/765
(58) Field of Search ................... 438/151, 155, 438/201, 211, 257, 261, 263, 264, 765, 769–772, 775–777, 787–788, 791–792

(56) References Cited

U.S. PATENT DOCUMENTS

| 5,498,577 A | * | 3/1996 | Fulford, Jr. et al. ......... 438/703 |
| 5,587,330 A | * | 12/1996 | Yamazaki ................... 438/162 |
| 5,591,681 A | * | 1/1997 | Wristers et al. ............. 438/762 |

FOREIGN PATENT DOCUMENTS

| JP | 405243577 A | * | 9/1993 |
| JP | 407106593 A | * | 4/1995 |

* cited by examiner

*Primary Examiner*—Carl Whitehead, Jr.
*Assistant Examiner*—Jamie L. Brophy
(74) *Attorney, Agent, or Firm*—Bachman & LaPointe, P.C.

(57) ABSTRACT

The present invention provides a highly reliable polycrystal silicon thin film transistor with $N_2O$ plasma oxide having an excellent leakage current characteristics comparable to the thermal oxide film formed on the crystalline silicon.

Also, the present invention provides a method of fabricating EEPROM or flash memory using $N_2O$ plasma oxide as a tunnel oxide, and $N_2O$ plasma oxide film as an interpoly dielectric between the floating gate and the control gate.

10 Claims, 8 Drawing Sheets

SEMICONDUCTOR DEVICE USING N₂O PLASMA OXIDE AND A METHOD OF FABRICATING THE SAME

CROSS REFERENCE TO RELATED APPLICATION

The instant application is a divisional of U.S. patent application Ser. No. 08/937,773 filed Sep. 25, 1997.

FIELD OF THE INVENTION

This invention generally relates to a semiconductor memory device, particularly to an electrically erasable/programmable read only memory (hereinafter, referred to as "EEPROM") or flash memory using $N_2O$ plasma oxide film as a tunnel oxide and an interpoly dielectric and a method of fabricating of the polysilicon thin film transistor with a high breakdown voltage and higher charge to breakdown characteristics to provide high-density flash memory or EEPROM.

BACKGROUND OF THE INVENTION

Generally, high-density flash memories or EEPROMs are nonvolatile memory devices operated depending on a difference between threshold voltages when electrons are injected and ejected from a silicon substrate into a floating gate via a gate oxide film or a tunnel oxide film.

Such high-density flash memory or EEPROM has been mainly used for the memory device of digital camera or personal computer. Thus, it is important to reduce the size of the memory cell in order to meet its cost performance.

The flash memory with the capacity of 1GB or more by the existing technology by which cell arrays and peripheral devices are disposed on the single crystalline silicon can be produced by a lithography process using ArF light source with a wavelength of 193 nm and a shallow trench isolation process having its isolation space of 0.25 µm or less, and it evitably increases the cost of memory device.

Such problems can be solved by using the polysilicon thin film transistor to form cell arrays, which provides high-density flash memory or EEPROM without increasing the cost.

Conventionally, since the polysilicon thin film transistor is formed of a mesa structure, it has advantages of small isolation space, ease fabricating process, fast operating speed because of reduced junction capacitance of only 10% as compared to the existing cell arrays, etc..

Figure 1:
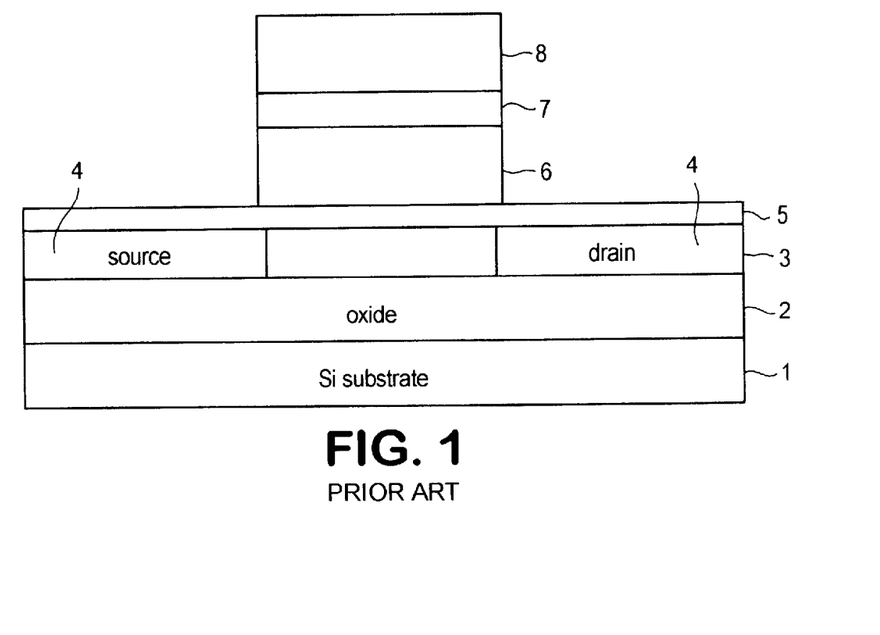
FIG. 1 a cross-sectional view taken along the bit-line direction of semiconductor device such as the flash memory or EEPROM which adopts polysilicon thin film transistor using conventional thermal oxide film or a high temperature oxide film as the gate oxide film.
Figure 2:
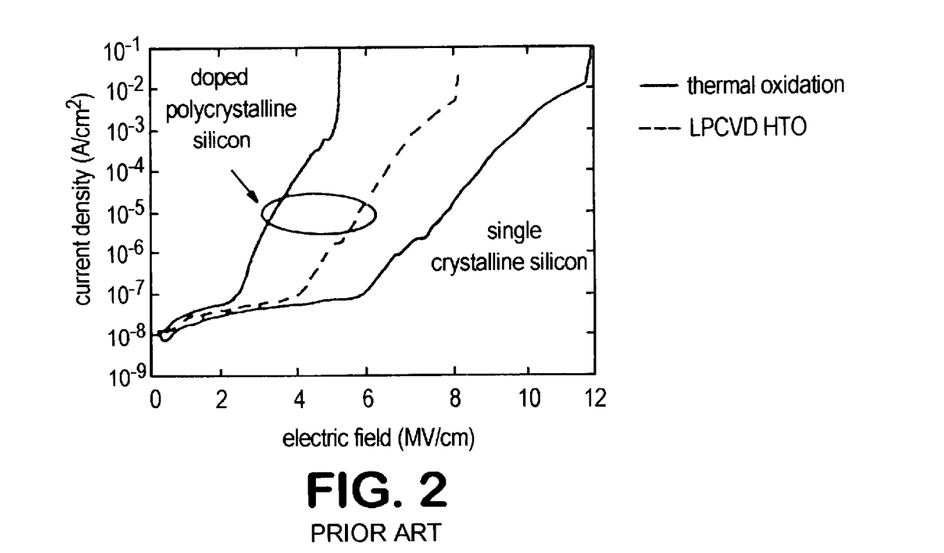
FIG. 2 is a graph showing the current density to the electric field characteristics between the oxide deposited on the polysilicon substrate and the oxide grown on the polysilicon substrate using thermal oxidation process in the flash memory or EEPROM.

However, the flash memory or EEPROM which adopts the polysilicon thin film transistor using thermal oxide film or high temperature oxide (HTO) formed by conventional method as a gate oxide film have poor leakage current and low breakdown voltage characteristics, compared to the thermal oxide film formed on the crystalline silicon as shown in FIG. 2.

Thus, it is necessary that the thin oxide film formed on the polysilicon has a high breakdown voltage and a high charge to breakdown characteristics in order to fabricate high-density flash memory or EEPROM using polysilicon thin film transistor.

Additionally, when the polysilicon thin film transistor is used as the switching device in an active matrix liquid crystal display, it is necessary to provide higher electron and hole mobilities, the excellent polyoxide and lower leakage current characteristics.

In order to achieve such characteristics, the roughness between the polysilicon and the polyoxide should be minimized and defects in the polysilicon thin film should also be eliminated. In other words, it is possible to produce a high performance polysilicon thin film transistor by providing the excellent gate oxide film.

A method which adopts the plasma process under $O_2$ ambient environment has been proposed to form the oxide film on the polysilicon substrate.

However, since this method has an extremely high growth rate, it is difficult to form the thinner oxide film.

Also, in the memory device, at the time of write or erase operation of informations, the number of electrons introduced into the floating gate should be kept constantly. However, when the film quality of the dielectric interposed between the floating gate and the control gate is deteriorated, its leakage current increases and the number of electrons being introduced thereto decreases.

As a result, the threshold voltage fluctuates, leading to an errornously operation in the memory device.

Therefore, for the high quality memory cell, it is necessary to improve the dielectric.

As has been explained, since the leakage current characteristics of the high-density flash memory or EEPROM provided with the thermal oxide film formed on the polysilicon is inferior to that of the thermal oxide film formed on the single crystalline silicon, the tripple layer structure comprised of an oxide/nitride/oxide has been used to improve the characteristics of interpoly dielectric.

However, the triple layer dielectric is very complex in its structure and is difficult to form the overall oxide film to have thickness of 13 nm. Further, since process to form the triple-layered structure should be performed at the high temperature of about 900° C., gate oxide can be deteriorated because of the stress of the nitride. Also, it is necessary for an expensive equipments for manufacturing this device, resulting in increase of its manufacturing cost.

SUMMARY OF THE INVENTION

Therefore, an object of the present invention is to provide a highly reliable thin film transistor with $N_2O$ plasma oxide having an excellent leakage current characteristics comparable to the thermal oxide film formed on the crystalline silicon.

Another object of the present invention is to provide a method of fabricating EEPROM or flash memory using $N_2O$ plasma oxide as a tunnel oxide.

Another object of the present invention is to provide an electrically erasable/programmable read only memory (EEPROM) and flash memory using $N_2O$ plasma oxide film as an interpoly dielectric between the floating gate and the control gate.

Still another object of the present invention is to provide a single layer $N_2O$ plasma oxide film in place of said triple layer structure.

Still another object of the present invention is to provide a highly reliable interpoly dielectric with a tripple layer structure comprised of: $N_2O$ plasma oxide in 1st layer—nitride in 2nd layer formed using a LPCVD under $SiH_4$ environment—oxide in 3th layer using thermal oxidation process under $N_2O$ environment.

DESCRIPTION OF SPECIFIC EMBODIMENTS

Now, a method which adopts plasma process under $N_2O$ ambient environment for forming the memory device such as semiconductor device, EEPROM and flash memory will be described.

Embodiment 1

The steps of producing EEPROM or flash memory using $N_2O$ plasma oxide as an interpoly dielectric will be described.

Figure 3A:
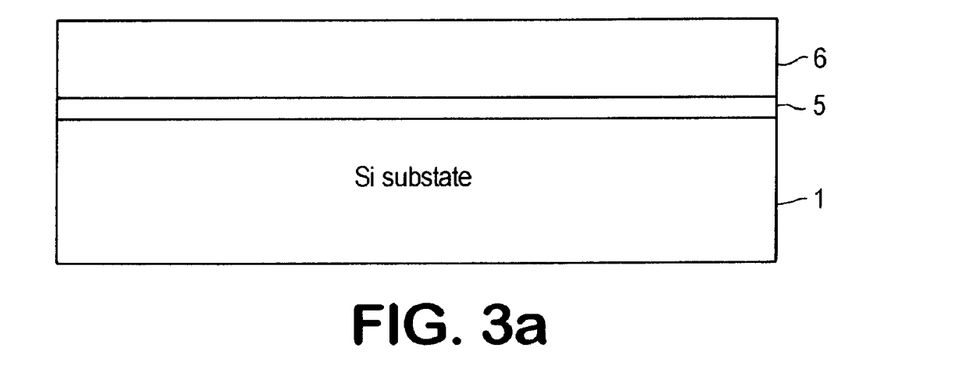
FIGS. 3a though FIG. 3c are cross-sectional views showing the steps of producing EEPROM or flash memory using $N_2O$ plasma oxide as an interpoly dielectric according to the present invention.
Figure 3B:
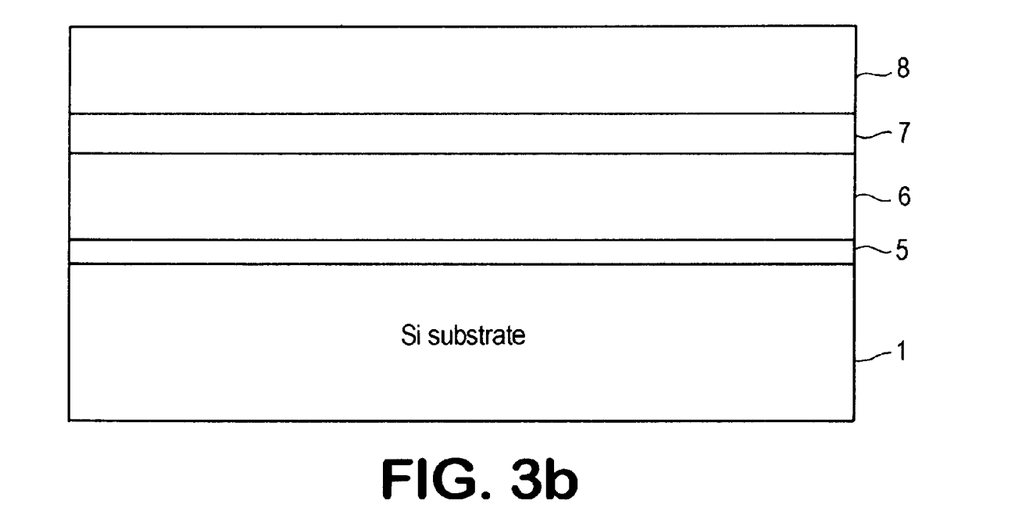

As shown in FIG. 3a, the gate oxide film or tunnel oxide film 5 is formed on the silicon substrate 1 and deposit the floating gate 6 to be doped thereon, then an interpoly dielectric 7 is deposited on the doped floating gate 6.

After depositing the interpoly dielectric 7, a polysilicon is deposited thereon, followed by doping to form a control gate.

In the this embodiment, the interpoly dielectric 7 has a triple-layered structure of an oxide- nitride-oxide(ONO), which will be described.

First, a first layer $N_2O$ plasma oxide film is formed by using high-density plasma generating apparatus such as an inductively coupled plasma (ICP), an electron cyclotron resonance(ECR), or Helicon under $O_2$ and NO or $N_2O$ environment.

Next, a second layer nitride film is formed by using Low-Pressure CVD(LPCVD) under $SiH_4/NH_3$ environment and a third layer oxide is formed by using a thermal oxidation process under $O_2$ and NO or $N_2O$ environment.

As a result, the interpoly dielectric 7 of triple-layered structure with ONO films can be obtained.

Figure 3C:
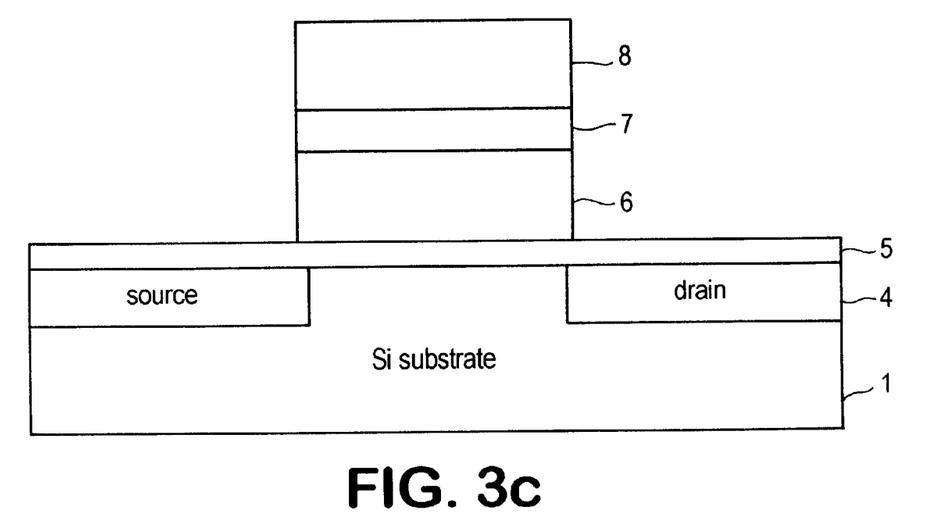

Thereafter, the control gate 8, the interpoly dielectric 7 and the floating gate 6 are etched in turn to form a gate, followed the source/drain region 4 is formed by using an ion implantatiom process, so that a memory cell having a structure shown in FIG. 3c can be obtained.

As a result, the semiconductor device such as EEPROM, flash memory etc. has a silicon substrate 1, a source/drain area 4 formed on both sides of the silicon substrate 1, a gate oxide film or tunnel oxide film 5 formed on the source/drain area 4, a floating gate 6 formed on the gate oxide film or tunnel oxide film 5, an interpoly dielectric 7, and a control gate 8, as shown in FIG. 3c.

Embodiment 2

In this embodiment, a single layer plasma oxide is formed in place of the triple-layered structure in the embodiment 1.

That is, a polyoxide which acts as the interpoly dielectric in the EEPROM, flash memory etc., is formed by using the ECR under $N_2O$ ambient environment to form a single layer $N_2O$ oxide film having a characteristics similar to the thermal oxide film formed on a crystalline silicon.

Of course, the single layer $N_2O$ oxide film as the interpoly dielectric in this embodiment is formed by using the high-density plasma generating apparatus such as the ICR, the ECR, or Helicon under $O_2$ and NO or $N_2O$ environment in the same manner as the embodiment 1.

Figure 4:
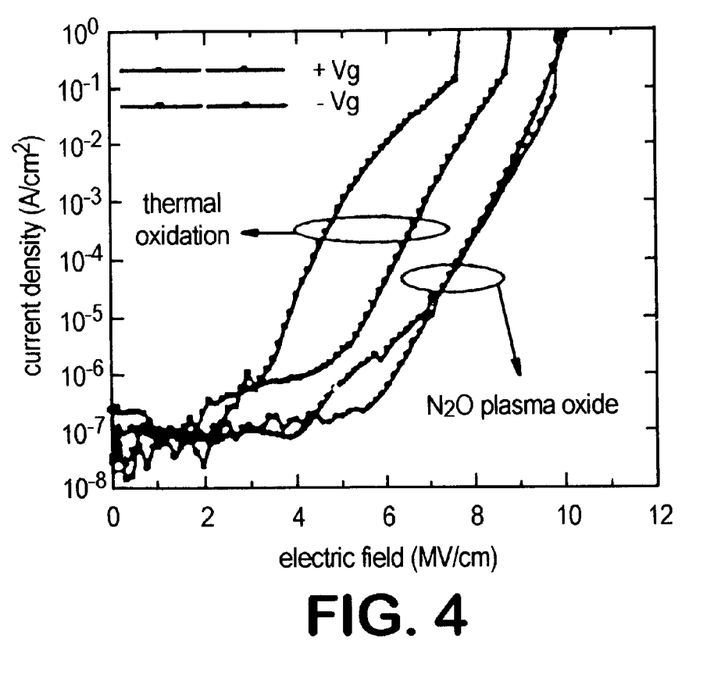
FIG. 4 is a graph showing the current density to the electric field characteristics of polyoxide formed using ECR $N_2O$ plasma process on the polysilicon film according to the present invention.
Figure 5:
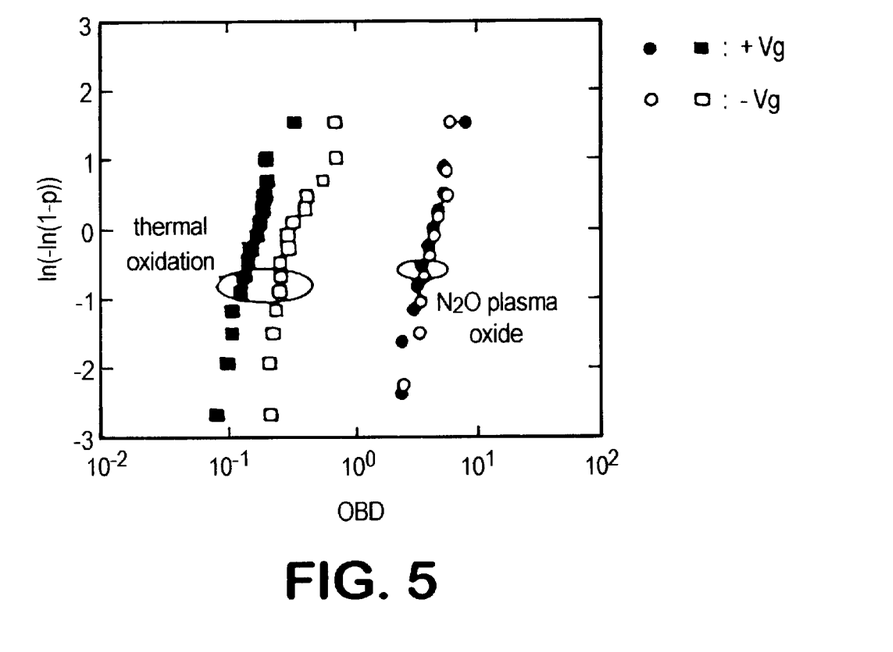
FIG. 5 is a graph showing the charge to breakdown characteristics of polyoxide formed using ECR $N_2O$ plasma process on the doped polysilicon gate according to the present invention.

Since the $N_2O$ oxide film produced using the ECR plasma under $N_2O$ ambient environment as mentioned above has a minute roughness in the interface between the oxide film and the doped floating gate, so that the current density to the electric field characteristics and a charge to breakdown characteristics of ECR plasma oxide film formed on the polysilicon can be improved as shown in FIG. 4 and FIG. 5.

Embodiment 3

Figure 6A:
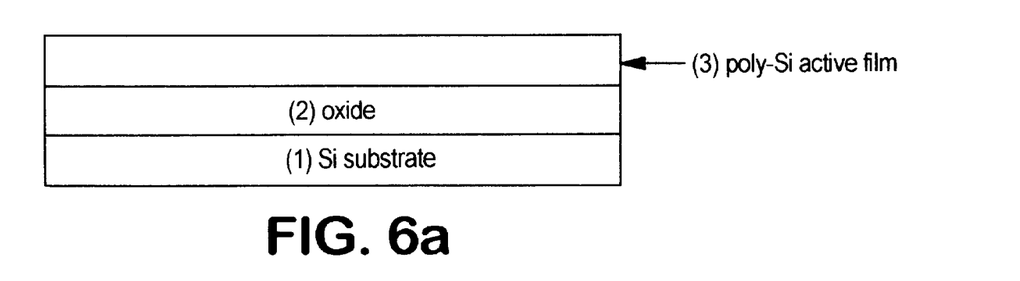
FIGS. 6a through 6c are cross-sectional views showing the steps of producing polysilicon thin film transistor using ECR $N_2O$ plasma oxide as the gate oxide film according to the present invention.
Figure 6B:
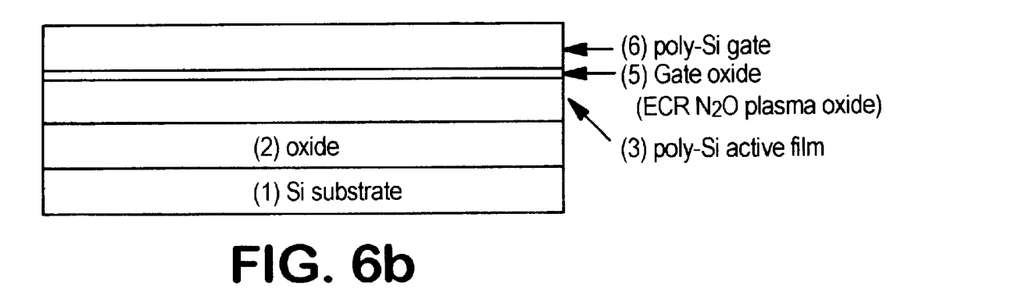
Figure 6C:
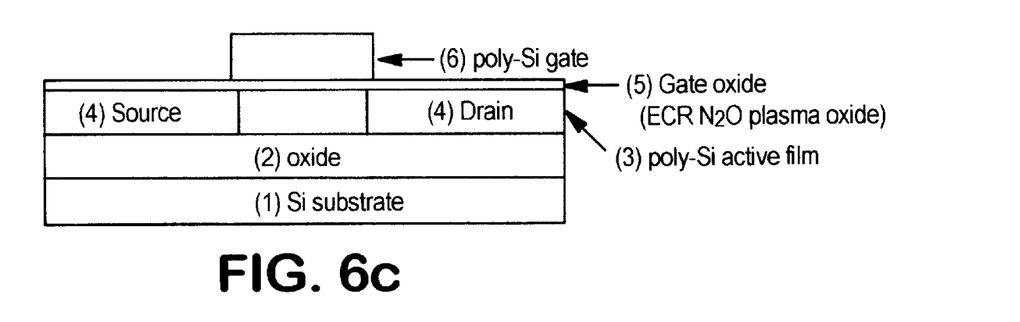

FIGS. 6a through 6c are cross-sectional views showing the steps of producing polysilicon thin film transistor using ECR $N_2O$ plasma oxide as the gate oxide film according to the present invention.

Referring to FIG. 6a, the oxide film 2 is deposited on the silicon substrate 1 and an amorphous silicon is deposited thereon, followed by annealing process to form polysilicon 3. Then, the gate oxide film is formed on the polysilicon 3 using ECR $N_2O$ plasma and the polysilicon film 6 is deposited thereon, as shown in FIG. 6b, followed by an etching process to form the gate 6. a source/drain region is formed using an ion implantation process, so that polysilicon thin film transistor has been completed.

Figure 7:
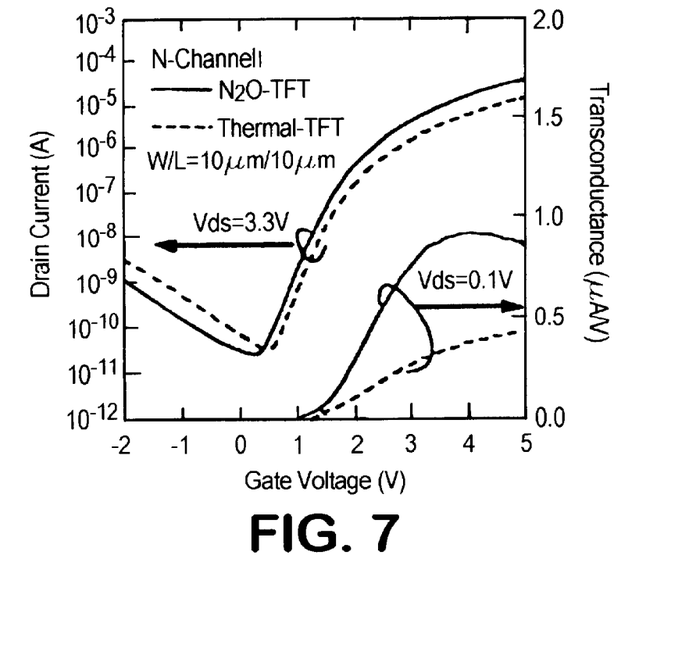
FIG. 7 is a graph showing the drain current, gate voltage and transconductance characteristics of the polysilicon thin film transistor using ECR $N_2O$ plasma oxide and the thermal oxide as the gate oxide film according to the present invention.

FIG. 7 is a graph showing the drain current, gate voltage and transconductance characteristics of the polysilicon thin film transistor using ECR $N_2O$ plasma oxide and the thermal oxide as the gate oxide film according to the present invention and Table 1 shows an electrical characteristics thereof. As apparent from FIG. 7 and Table 1, the electron mobility of the polysilicon thin film transistor using ECR $N_2O$ plasma oxide is about 3 times as large as that of thermal oxide film, and the ratio of ON-current to OFF-leakage current also shows an excellent characteristics. This is because ECR $N_2O$ plasma oxide in the polysilicon thin film transistor has a very excellent characteristics.

TABLE 1

|  | Thermal-TFT N-ch. | $N_2O$-TFT N-Ch |
| --- | --- | --- |
| Tox[nm] | 9.7 | 12 |
| $v_T$[V] | 1.55 | 1.43 |
| s[V/dec] | 0.32 | 0.32 |
| u[cm$^2$/Vs] | 12.1 | 33.8 |
| $N_T$[$10^{12}$] | 9.75 | 7.76 |
| Ioff[pA/m] | 3.0 | 2.75 |
| On/Off[$10^6$] | 0.50 | 1.35 |

Embodiment 4

Figure 8A:
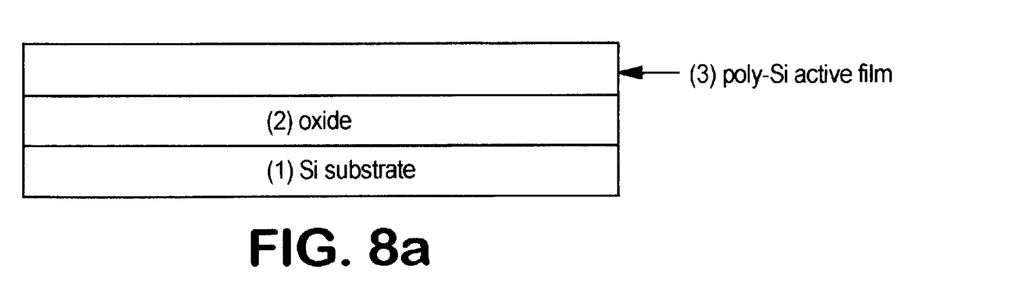
FIGS. 8a through 8c are cross-sectional views showing the steps of producing semiconductor device such as the flash memory or EEPROM using ECR $N_2O$ plasma oxide as the gate oxide film according to the present invention.
Figure 8B:
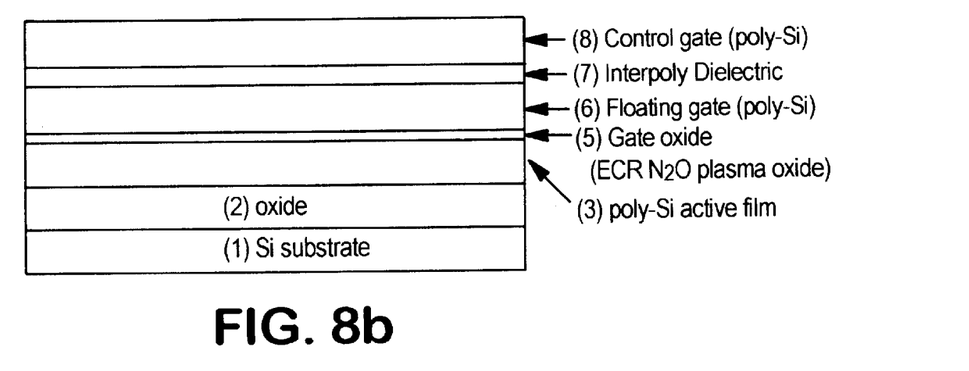
Figure 8C:
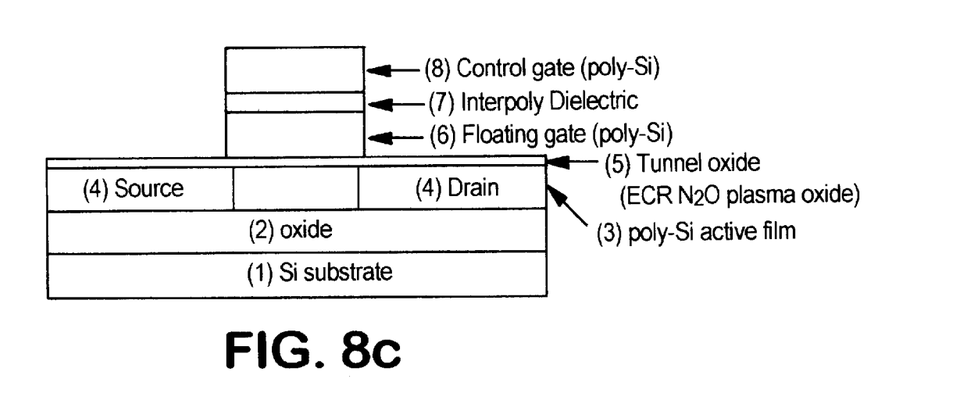

On the other hand, FIGS. 8a through 8c are cross-sectional views showing the steps of producing flash memory cells or EEPROMs using ECR $N_2O$ plasma oxide as the gate oxide according to the present invention.

Referring to FIG. 8a, the oxide film 2 is deposited on the silicon substrate 1 and an amorphous silicon is deposited thereon, followed by annealing process to form polysilicon 3. Then, the gate oxide film 5 is formed on the polysilicon 3 using ECR $N_2O$ plasma and the polysilicon is deposited thereon, followed by forming the interpoly dielectric 7, then polysilicon films are deposited to form the control gate. Thereafter, the control gate 8, the interpoly dielectric 7 and the floating gate 6 are etched in turn to form a gate, followed the source/drain region 4 is formed by using an ion implantation process, so that a memory cell having a structure shown in FIG. 8c can be obtained.

Figure 9:
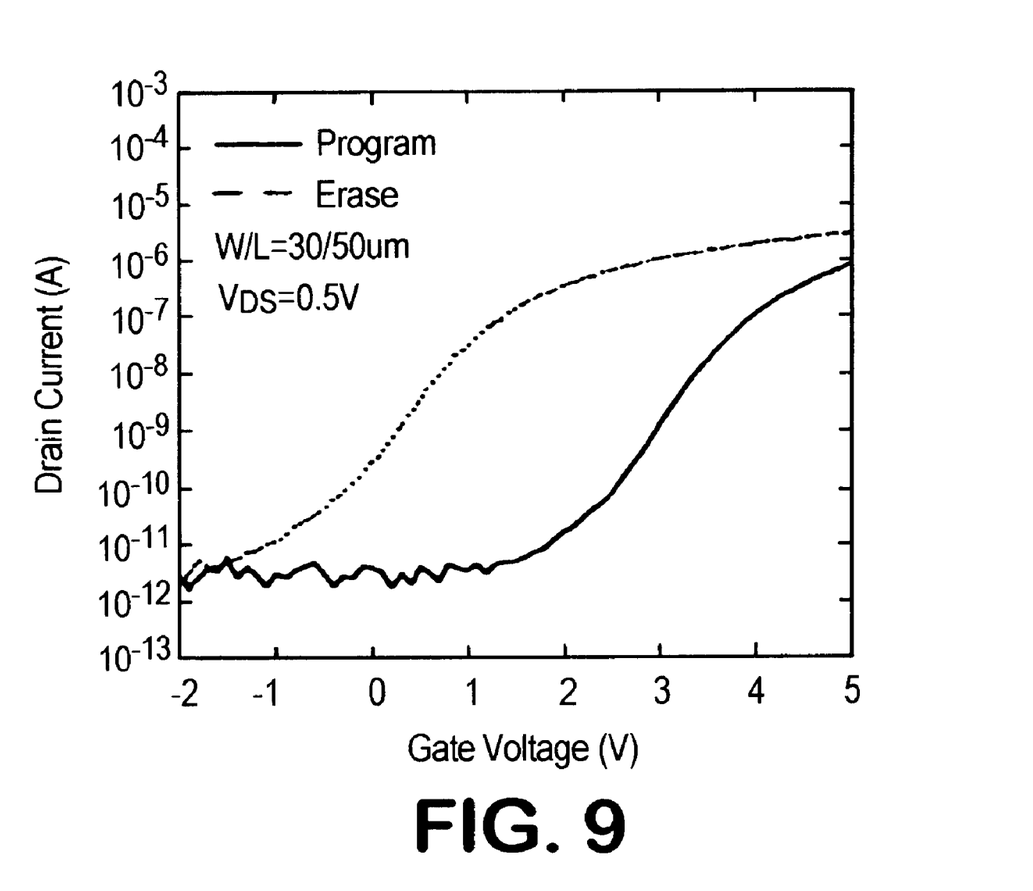
FIG. 9 is a graph showing the threshold voltage characteristic in before and after electrons are injected to the floating gate of flash memory or EEPROM using ECR $N_2O$ plasma oxide as the gate oxide film according to the present invention.

FIG. 9 is a graph showing the threshold voltage characteristics in before and after electrons are injected to the floating gate of flash memory or EEPROM using ECR $N_2O$ plasma oxide as the gate oxide film according to the present invention.

From the FIG. 9, it is understood that the difference between threshold voltages is only 4 volts, which is similar to that of flash memory or EEPROM on the single crystalline silicon substrate.

As described above, in accordance with the present invention, a highly reliable thin film transistor with $N_2O$ plasma oxide having an excellent leakage current characteristics comparable to the thermal oxide film formed on the crystalline silicon can be obtained.

In particular, it is possible to provide highly reliable EEPROM or flash memory with $N_2O$ plasma tunnel oxide.

Further, it is possible to produce the highly reliable polysilicon thin film transistor using ECR $N_2O$ plasma oxide as gate oxide film according to the present invention.

While the invention has been described with reference to a specific embodiment, the description is meant to be construed in a limiting sense. Various modification of the disclosed embodiment, as well as other embodiment of the invention, will be apparent to persons skilled in the art upon reference to this description. It is therefore contemplated that the appended claims and their legal equivalents will cover any such modifications or embodiments which fall within the scope of the invention.

What is claimed is:

1. A method of fabricating semiconductor device comprising the steps of:
   a) forming gate oxide film on a silicon substrate;
   b) depositing polycrystal silicon to form a floating gate, and depositing one of (1) a triple-layered interpoly dielectric which includes a plasma oxide film and (2) a single plasma oxide film, then depositing polycrystal silicon to form a control gate;
   c) forming a gate electrode by etching sequentially the control gate, the interpoly dielectric or the single plasma oxide film, and the floating gate; and
   d) forming a source/drain region on the silicon substrate by using an ion implantation process.

2. A method of fabricating semiconductor device according to claim 1, in the step b), the interpoly dielectric has a triple-layered structure of plasma oxide/nitride/oxide.

3. A method of fabricating semiconductor device according to claim 1, the plasma oxide film is formed by using high-density plasma generating apparatuses such as the ICR, the ECR, or Helicon under a gas environment selected from the group consisting of (1) $O_2$ and NO, and (2) $N_2O$.

4. A method of fabricating semiconductor device according to claim 2, the nitride film is formed by using Low-Pressure CVD(LPCVD) under $SiH_4/NH_3$ environment.

5. A method of fabricating semiconductor device according to claim 2, the third layer oxide is formed by using thermal oxidation process under a gas environment selected from the group consisting of (1) $O_2$ and NO, and (2) $N_2O$.

6. A method of fabricating semiconductor device comprising the steps of:
   a) forming an oxide film on a silicon substrate; depositing an amorphous silicon film on the oxide film and subjecting the substrate to an annealing film on the oxide film polycrystal silicon active region;
   b) forming a gate oxide film on the polycrystal silicon active region, depositing polycrystal silicon to form a floating gate, and depositing one of (1) a tripled layered interpoly dielectric which includes a plasma oxide film and (2) a single plasma oxide film, thereafter depositing polycrystal silicon to form a control gate;
   c) forming a gate by etching sequentially the control gate, the interpoly dielectric the single plasma oxide and the floating gate; and
   d) forming a source/drain region on the silicon active region by using an ion implantation process.

7. A method of fabricating semiconductor device according to claim 6, in the step b), said gate oxide film is plasma oxide film formed by plasma oxidation method.

8. A method of fabricating semiconductor device according to claim 6 the plasma oxide film is formed by using high-density plasma generating apparatuses such as the ICR, the ECR, or Helicon under a gas environment selected from the group consisting of (1) $O_2$ and NO, and (2) $N_2O$.

9. A method of fabricating semiconductor device according to claim 2, the plasma oxide film is formed by using high-density plasma generating apparatuses such as the ICR, the ECR, or Helicon under a gas environment selected from the group consisting of (1) $O_2$ and NO, and (2) $N_2O$.

10. A method of fabricating semiconductor device according to claim 7, the plasma oxide film is formed by using high-density plasma generating apparatuses such as the ICR, the ECR, or Helicon under a gas environment selected from the group consisting of (1) $O_2$ and NO, and (2) $N_2O$.

* * * * *

UNITED STATES PATENT AND TRADEMARK OFFICE
CERTIFICATE OF CORRECTION

PATENT NO. : 6,461,984 B1
DATED : October 8, 2002
INVENTOR(S) : Chul-Hi Han et al.

It is certified that error appears in the above-identified patent and that said Letters Patent is hereby corrected as shown below:

<u>Title page,</u>
Item [75], Inventors, "Chui-Hi Han" should be corrected to -- Chul-Hi Han --.

<u>Drawings,</u>
Figure 3a, "Si substate" should be corrected to read -- Si substrate --.

<u>Column 6,</u>
Lines 31 and 32, "film on the oxide film" should be corrected to -- treatment, to form --.
Line 35, "tripled layered" should be corrected to -- triple-layered --.
Line 39, after the word "gate" the word -- electrode -- should be inserted.
Line 40, after the word "dielectric" -- or -- should be inserted.

Signed and Sealed this

Thirtieth Day of September, 2003

JAMES E. ROGAN
*Director of the United States Patent and Trademark Office*